(12) United States Patent
Hintz et al.

(10) Patent No.: US 7,068,030 B2
(45) Date of Patent: Jun. 27, 2006

(54) MAGNETIC FIELD STRENGTH DETECTOR

(75) Inventors: Michael B. Hintz, Mahtomedi, MN (US); Richard E. Jewett, Minneapolis, MN (US); Steven L. Lindblom, Inver Grove Heights, MN (US); Stephen J. Rothermel, Roseville, MN (US)

(73) Assignee: Imation Corp., Oakdale, MN (US)

( * ) Notice: Subject to any disclaimer, the term of this patent is extended or adjusted under 35 U.S.C. 154(b) by 55 days.

(21) Appl. No.: 10/833,779

(22) Filed: Apr. 28, 2004

(65) Prior Publication Data

US 2005/0242804 A1    Nov. 3, 2005

(51) Int. Cl.
*G01R 33/02*    (2006.01)
*G01N 27/72*    (2006.01)

(52) U.S. Cl. ..................... 324/244; 324/239

(58) Field of Classification Search ........ 324/239–244, 324/249, 251, 252, 258, 260–262, 207.12–207.22
See application file for complete search history.

(56) References Cited

U.S. PATENT DOCUMENTS 4,616,207 A * 10/1986 Knapp et al. ............. 338/32 H
4,849,696 A     7/1989 Brun et al.
5,278,500 A *  1/1994 Seitz ........................... 324/249
6,348,800 B1 * 2/2002 Haensgen et al. .......... 324/500

FOREIGN PATENT DOCUMENTS

| EP | 0 290 811 B1 | 4/1988 |
| EP | 0 411 971 B1 | 5/1990 |
| EP | 0 696 356 B1 | 1/2004 |
| JP | 06275427 A * | 9/1994 |
| WO | WO 95/23342 | 8/1995 |

* cited by examiner

*Primary Examiner*—Bot LeDynh
(74) *Attorney, Agent, or Firm*—Eric D. Levinson

(57) ABSTRACT

A magnetic field strength detector includes a magnetic field sensing element that outputs voltage as a function of magnetic field strength. In some embodiments, the magnetic field sensing element comprises a coil, and voltage is induced across the coil as a function of the magnetic field strength. A magnetic field strength detector also includes an indicator that alters as a function of the voltage output by the magnetic field sensing element when the magnetic field strength exceeds a threshold. The alteration is substantially irreversible and, in some embodiments, visible. The detector may be used to, for example, measure the strength of a magnetic field generated by a degaussing device, or to confirm that a particular medium was exposed to a magnetic field with a strength adequate to degauss the medium.

17 Claims, 14 Drawing Sheets

MAGNETIC FIELD STRENGTH DETECTOR

TECHNICAL FIELD

The invention relates to magnetic media and, more particularly, to erasing, i.e., degaussing, of magnetic media.

BACKGROUND

As the quantity of data stored in digital form continues to rapidly increase, maintaining secure control of sensitive individual, business, financial institution, and government agency digital data becomes increasingly difficult. Data is often stored, for example, as discrete magnetization patterns on magnetic data storage media, such as magnetic tape or disks. One aspect of digital data security for magnetic media is erasure, i.e., degaussing, of the media. Degaussing is commonly performed to eliminate stored information from magnetic media, and can be very important, particularly when the data to be erased is confidential, private, or highly classified. Degaussing is also commonly performed during media fabrication, e.g., prior to servo writing to ensure that the servo patterns can be properly written.

In general, degaussing of a magnetic medium involves exposing the medium to a magnetic field of sufficient strength, e.g., flux density, to randomly magnetize the medium, thereby destroying the discrete magnetization patterns which comprise the stored data. Degaussing devices may employ a variety of techniques to create such a magnetic field, such as use of alternating or pulsed current to drive a coil. These techniques provide an alternating or pulsed magnetic field, respectively. Other degaussing devices employ a fixed magnet. Fixed magnet degaussing devices are typically used for "emergency" data destruction applications where a means to destroy data without external power is required.

SUMMARY

In general, the invention is directed to techniques for detecting magnetic field strength, e.g., magnetic flux density. A magnetic field strength detector according to the invention may be used to, for example, confirm a manufacturer-indicated field strength for a degaussing device, or to confirm that the degaussing device generates a field with a strength adequate to degauss media. In some embodiments, a magnetic field strength detector may be associated with, and in some cases attached to, a particular magnetic medium. In such embodiments, the magnetic field strength detector may be used to confirm that the associated medium was exposed to a field with a strength adequate to degauss the medium.

Existing devices for detecting magnetic field strength and/or verifying degausser performance typically include a magnetic sensor, such as a Hall effect probe, and associated electronics. Such devices may be bulky and expensive. Further, the field strength measurement provided by such devices is typically a temporary value displayed via a digital display, and is not associated with any particular medium. In at least some embodiments, the invention eliminates these conventional limitations by providing low cost magnetic field strength detector with a relatively small volume that is capable of being used and read by a layperson.

Another conventional technique for verifying degausser performance involves reading the degaussed medium, such as tape, on a drive to look for remaining signals in order to confirm that information cannot be recovered. In the case of a hard drive, the drive itself might be put into a computer and then tested. This technique can be quite time consuming. In some cases, rather than use these undesirable existing techniques to measure magnetic field strength and/or verify degausser performance, each medium is mechanically destroyed to ensure that data cannot be retrieved, which can itself be an expensive technique for ensuring data security.

A magnetic field strength detector according to the invention includes a magnetic field sensing element that outputs voltage as a function of magnetic field strength. In some embodiments, the magnetic field sensing element comprises a coil, and voltage is induced across the coil as a function of the magnetic field strength. In particular, in such embodiments voltage is induced across the coil in the presence of an alternating current (AC) or pulsed current driven magnetic field. In other embodiments, the magnetic field detector comprises a simple Hall effect sensor or magneto-resistive sensor that is capable of outputting a voltage in the presence of a static (DC) magnetic field. In still other embodiments, the magnetic field detector comprises a magnetic switch, such as a reed switch, that closes in the presence of a magnetic field with an adequate strength.

A magnetic field strength detector may also include a circuit coupled to magnetic field sensing element to receive the voltage output by the sensing element. The detector also includes an indicator, which receives the output voltage. In particular, the indicator may be altered as a function of the voltage presented to the circuit by the magnetic field sensing element when the magnetic field strength exceeds a threshold. The alteration may be substantially irreversible and, in some embodiments, visible. For example, the indicator may comprise a fuse element within the circuit that is configured to fail when the current therethrough exceeds a threshold amount as a consequence of the magnetic field strength that the detector is exposed to exceeding a threshold amount. In that case, the indicator can provide a visible (and possibly irreversible) indication that a threshold field strength has been exceeded.

In some embodiments, the magnetic field strength detector is a card-like or tape-like device that includes one or more flexible substrate layers. The substrate layers may be formed of a polyimide or another suitable substrate material. In such embodiments, at least some of the components of the device, such as the coil, the circuit, and the fuse elements, may be thin-film elements formed on the one or more substrate layers. The components may be, for example, thin-film copper elements formed on the one or more substrate layers by at least one of electroplating, laser cutting, sputtering, vapor deposition, and etching.

Some magnetic field strength detector embodiments that include substrate layers may also include additional layers, such as an adhesive layer to allow the device to be affixed to an associated medium. A top layer that may be transparent or lens-like may also be used. The top layer may protect thin film components and, where transparent or lens-like, may allow a user to view the alteration to the indicator caused by exposure of the detector to a magnetic field with a strength that exceeds the predetermined threshold value for the indicator. For example, a user may be able to view a failed fuse, and, in some cases, failure of the fuse may cause the top layer to change color. The top layer may include a printed indication of the threshold magnetic field strength value associated with alteration of the indicator.

In some embodiments, the magnetic field strength detector includes a plurality of indicators. Each of the indicators is configured to be altered in response to exposure of the device to a different magnetic field strength, i.e., each of the indicators configured for different magnetic field strength threshold. In such embodiments, the magnetic field strength detector may be considered a magnetic field strength measurement device in that it is capable of measuring magnetic field strength within a range from the lowest threshold to the highest threshold. The accuracy of such a magnetic field strength detector as measurement device depends upon the number of indicators provided within the range, i.e., the field strength difference between adjacent indicators.

In some embodiments, for example, the circuit of the magnetic field strength detector includes a ladder of fuse elements in parallel. In such embodiments, the fuse elements configured such that a magnetic field above a given threshold associated with one of the fuse elements will cause that fuse element and each fuse element "below" that fuse element on the ladder to fail. In this way, a plurality of fuse elements can define a plurality of thresholds so that exposure over a given threshold is detectable.

The circuit may also include resistive elements to allow for easier configuration of the fuse elements to accommodate varying field strengths. In other words, the resistive elements may be used to control the amount of current presented to each of the fuse elements within the circuit such that each fuse element will fail in the presence of its predetermined magnetic field strength threshold.

In one embodiment, the invention is directed to a magnetic field strength detector that includes a magnetic field sensing element and an indicator. The magnetic field sensing element outputs voltage as a function of magnetic field strength. The indicator alters as a function of the voltage output by magnetic field detector when the magnetic field strength exceeds a threshold, and the alteration of the indicator is substantially irreversible.

In another embodiment, the invention is directed to a magnetic field strength detector that includes a coil and a fuse element coupled to the coil. Voltage is induced across the coil as a function of magnetic field strength. The fuse element fails based on a current presented to the fuse element as a result of the voltage induced across the coil when the magnetic field strength exceeds a threshold. The magnetic field strength detector further includes plurality of substrate layers, wherein each of the coil and the fuse element are formed on at least one of the substrate layers.

The invention may be capable of providing one or more advantages. For example, a magnetic field strength detector according to the invention may provide a simple, traceable means of verifying field strength of a degaussing device and/or verifying that a particular medium has been adequately degaussed. A magnetic field strength detector according to the invention may have a small volume and low cost relative to existing devices, enabling direct attachment to individual pieces of media. A magnetic field strength detector according to the invention may be used by a layperson, and a magnetic field strength indicated by the detector may be read by the layperson. Further, substantially irreversible alteration of the indicator may enable direct and repeated verification of field strength at any time after exposure, and may frustrate attempts to tamper with the detector.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
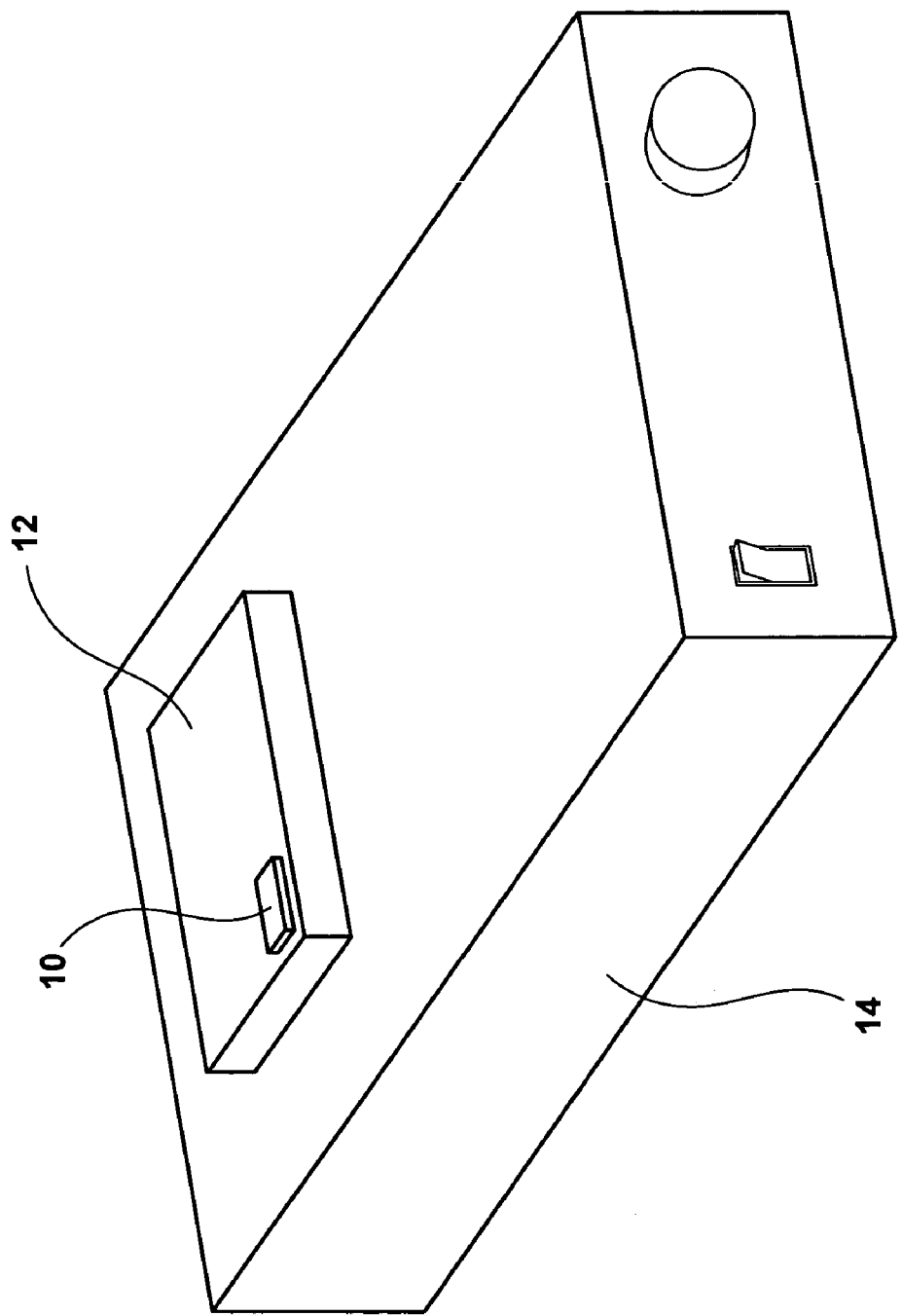
FIG. 1 is a conceptual diagram illustrating use of an example magnetic field strength detector during degaussing of a medium.

FIG. 1 is a conceptual diagram illustrating use of an example magnetic field strength detector 10 during degaussing of a medium 12. In the illustrated example, magnetic field strength detector 10 is exposed to, and measures the strength, e.g., the flux density, of a magnetic field (not shown) generated by a degaussing device 14. In particular, as will be described in greater detail below, detector 10 includes at least one indicator that is altered in a substantially irreversible manner when the strength of the magnetic field generated by degaussing device 14 exceeds a threshold. A user may read detector 10 to determine if the strength of the magnetic field generated by degaussing device 14, i.e., the strength of the magnetic field that medium 12 was exposed to, exceeded the threshold value.

Medium 12 may take the form of any magnetic medium, such as a magnetic tape or disk. In order to degauss medium 12, degaussing device 14 must expose substantially the entire volume of medium 12 to a magnetic field of sufficient strength to randomly magnetize the medium, thereby destroying the discrete magnetization patterns which comprise the data stored on the medium. Degaussing device 14 may generate an alternating magnetic field by, for example, energizing one or more electromagnets at the incoming power line frequency (50 or 60 Hz), or may generate a pulsed magnetic field by applying pulsed electrical current to one or more electromagnets. Measurement devices 10 according to the invention are not limited to use with any particular type of degaussing device 14, medium 12, or technique for degaussing magnetic media.

In the illustrated example, detector 10 is affixed to and associated with medium 12. Detector 10 may be attached to medium 12, for example, after manufacture or before degaussing. When associated with medium 12, detector 10 may be used to confirm that medium 12 was exposed to a magnetic field of adequate strength to degauss medium 12 during degaussing by degaussing device 14. Each of a number of pieces of media degaussed by degaussing device 14 may be associated with a measuring device for this purpose.

In other embodiments, however, a detector 10 may simply be placed on degaussing device 14 without a medium 12, or on an empty cartridge intended to simulate the volume of a medium 12. In such embodiments, detector 10 may be used to measure the strength of the magnetic field generated by degaussing device 14, e.g., to confirm that the field strength is adequate to degauss media and/or the field strength indicated by a manufacturer of degaussing device 14. Although broadly applicable for use with any type of degaussing device 14, magnetic medium 12, and degaussing technique, detector 10 may be configured for a particular type of degaussing device 14, type of magnetic medium 12, and degaussing technique employed by degaussing device 14. For example, detector 10 may include indicators configured to be altered when the strength of the magnetic field generated by degaussing device 14 exceeds a threshold, with the threshold selected based on the type of degaussing device 14, type of magnetic medium 12, and degaussing technique employed by degaussing device 14.

Although FIG. 1 illustrates only a single detector 10 affixed to medium 12, any number of detectors 10 may be affixed to a single medium 12, affixed to a single empty cartridge, or placed together on degaussing device 14. A plurality of detectors 10 may be, for example, arranged as an array to measure the uniformity of the field generated by degaussing device 14, or to confirm that the entire volume of a medium was exposed to a field of adequate strength for degaussing of the medium. Further, in general, detector 10 is affixed to medium 12 such that it is substantially orthogonal to the field generated by degaussing device 14. In some embodiments, degaussing device 14 may generate a multi-axis field, and a plurality of detectors 10 may be aligned on respective axes, e.g., orthogonally.

In some embodiments, as illustrated in FIG. 1, detector 10 is a small card-like or tape-like device that may be affixed to medium 12. As will be described in greater detail below, detector 10 may include thin-film components formed on one or more flexible substrate layers. Embodiments of detector 10 may also include additional layers, such as an adhesive layer to allow detector 10 to be affixed to medium 12 and a top layer that may be transparent or lens-like. The top layer may protect thin film components and, where transparent or lens-like, may allow a user to view the alteration to the indicator caused by exposure of detector 10 to a magnetic field with a strength that exceeds the undetermined threshold value for the indicator.

In other words, magnetic field strength detector 10 may provide a small, simple, and relatively inexpensive means of verifying field strength of degaussing device 14 and/or verifying that medium 12 has been adequately degaussed. In some cases, detector 10 may be used, and a magnetic field strength indicated by the device may be read by a layperson. Further, substantially irreversible alteration of the indicator, which will be described in greater detail below, may enable direct and repeated verification of magnetic field strength at any time after exposure.

Figure 2:
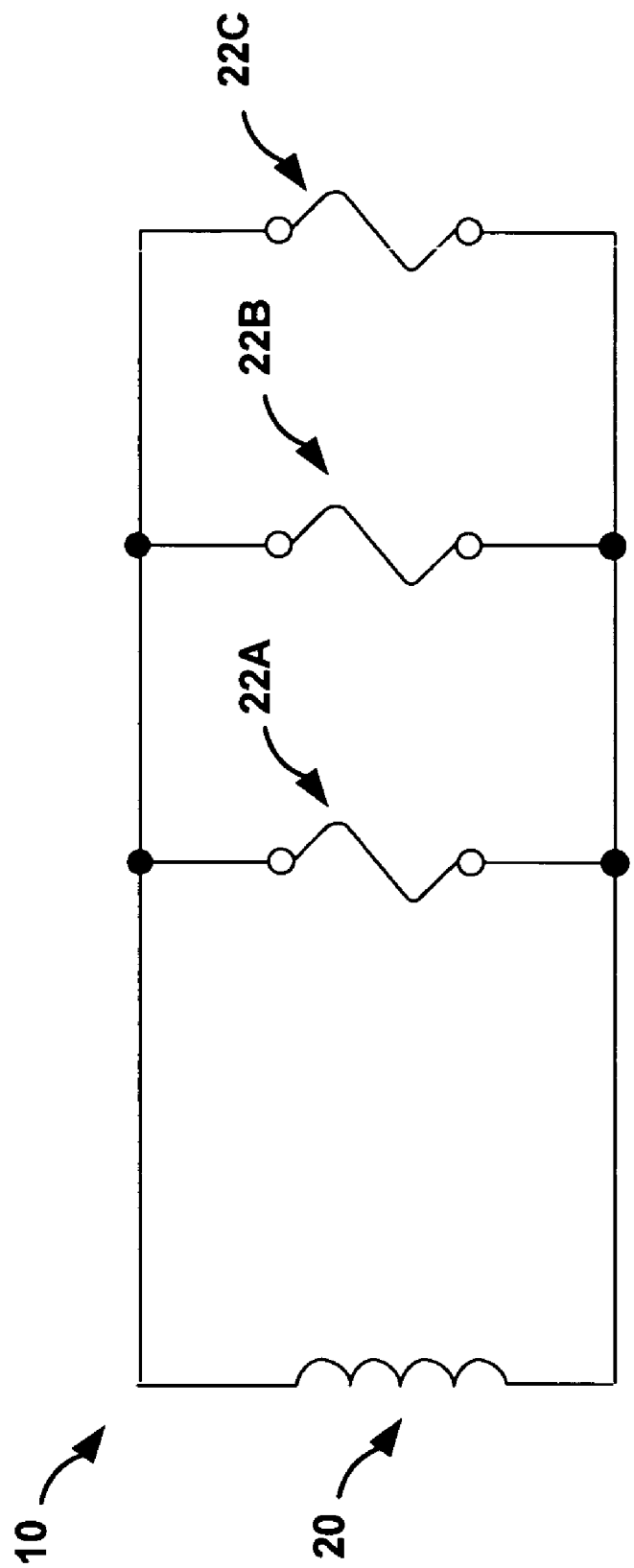
FIG. 2 is a circuit diagram representation of the example magnetic field strength detector of FIG. 1.

FIG. 2 is a circuit diagram representation of magnetic field strength detector 10. In particular, the circuit diagram of FIG. 2 illustrates fundamental components of a magnetic field strength detector according to some embodiments of the invention. As illustrated in FIG. 2, detector 10 includes an inductive element 20 and resistive elements 22A–22C ("resistive elements 22"). Resistive elements 22 are arranged in parallel with each other and inductor 20. Inductive element 20 may itself have a significant resistance.

When inductive element 20 is exposed to an AC or pulsed magnetic field, a voltage is induced across inductive element 20 and, consequently, each of resistive elements 22. The magnitude of the voltage induced across inductive element 20 is a function of the strength of the magnetic field which inductor 20 is exposed to. In other words, inductive element 20 acts as a magnetic field sensing element that outputs voltage as a function of the strength of a magnetic field to which it is exposed.

As will be described in greater detail below, each of resistive elements 22 may comprise a fuse element that is configured to fail, e.g., melt, when the current therethrough exceeds a threshold value. Current flows through each of resistive elements 22 as a function of their resistance and the magnitude of the voltage induced across inductive element 20. Consequently, the instantaneous current through each of resistive elements 22, and thus each of the fuse elements, depends on the strength of the magnetic field which inductive element 20 is exposed to.

The resistance of each of resistive elements 22 and the current threshold of each of the fuse elements may be selected such that each of the fuse elements fails at a different magnetic field strength. In other words, each fuse element may be associated with a field strength threshold, and failure of one or more fuse elements may indicate that detector 10 was exposed to a field strength greater than a threshold. For example, a first fuse element within resistive element 22A may fail at a first threshold, a second fuse element within resistive element 22B may fail at a second threshold, and a third fuse element within resistive element 22C may fail at a third threshold. In such embodiments, each of the fuse elements acts as an indicator that is altered in a substantially irreversible manner as a function of the voltage output by inductive element 20 when the magnetic field strength exceeds a threshold associated with the fuse element.

Figure 3:
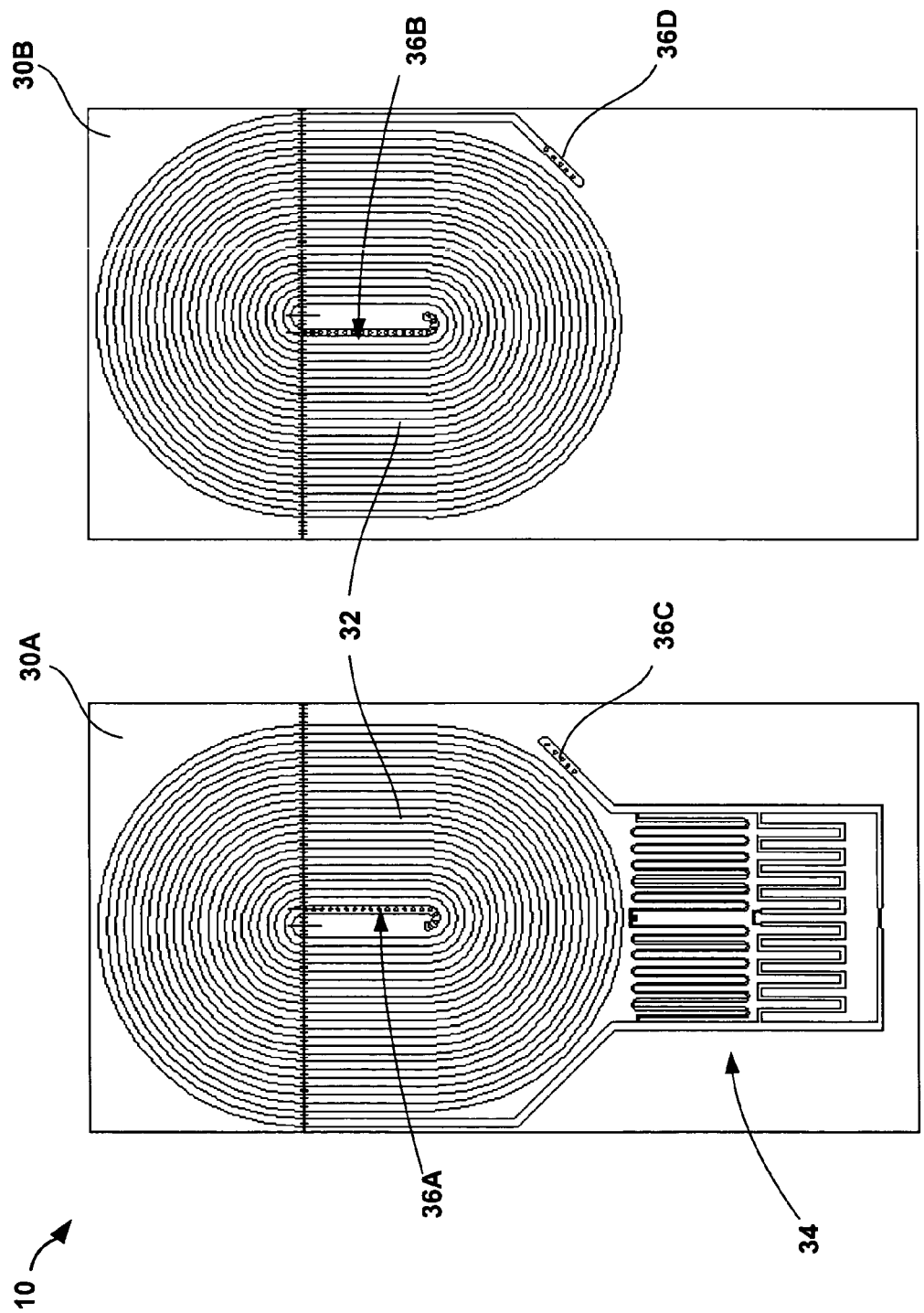
FIG. 3 is schematic diagram further illustrating the example magnetic field strength detector of FIG. 1.

FIG. 3 is schematic diagram further illustrating magnetic field strength detector 10. In the illustrated embodiment, detector 10 includes two substrate layers 30A and 301B ("substrate layers 30"). Substrate layers 30 may be thin and flexible, and may be formed of, for example, a polyimide or another suitable substrate material. Components of detector 10 may be thin film components formed on one or more of substrate layers 30. Consequently, the size of detector 10 may be quite small relative to existing magnetic field detection devices. Moreover, use of thin film components allows detector 10 to take a card-like or tape-like form suitable for attachment to an individual medium.

In the illustrated example, detector 10 includes a coil 32, which corresponds to inductive element 20 (FIG. 2) formed on both of substrate layers 30. Detector 10 also includes a circuit 34 formed on substrate 30A, which is coupled to coil 32, and includes resistive elements 22 and fuse elements discussed with reference to FIG. 2. The overall circuit including coil 32 and circuit 34 is completed via interlayer contacts 36A–36D, which may comprise conductive traces through substrate layers 30.

Coil 32 and circuit 34 may be formed of any of a variety of conductive materials, such as copper, and may be formed on substrate layers 30 using any of a variety of known techniques, such as electroplating, laser cutting, vapor deposition, and sputtering. In some embodiments, coil and/or circuit may be etched, e.g., via photolithography or another wet chemical etching process. In some embodiments, the impedance of including coil 32 and/or circuit 34 may be monitored during the process by which they are formed and used to control the process. Use of impedance to control the process of forming coil 32 and/or circuit 34 may lead to more precisely formed elements, which may in turn lead to a magnetic field strength detector 10 that is capable of more accurately identifying whether it has been exposed to a magnetic field strength above a threshold value.

The illustrated configuration of detector 10 is merely exemplary. For example, coil 32 need not be formed on two substrate layers 30. Both coil 32 and circuit 34 may be formed on any number of substrate layers. Further, the relative size of coil 32 and circuit 34 are merely exemplary, and coil 32 may, in some embodiments, be significantly larger than circuit 34. Detector 10 may be less than 5 inches in length and width, and is preferably between 0.1 and 1 inches in length and width. Detector 10 may be less than 0.1 inches thick, and is preferably between 0.003 and 0.02 inches thick. The thickness of coil 32, for example, may be between 0.0007 and 0.004 inches per substrate layer. Such small dimensions, and specifically thicknesses less than 0.1 inches make detector 10 well suited for use with magnetic media.

Figure 4:
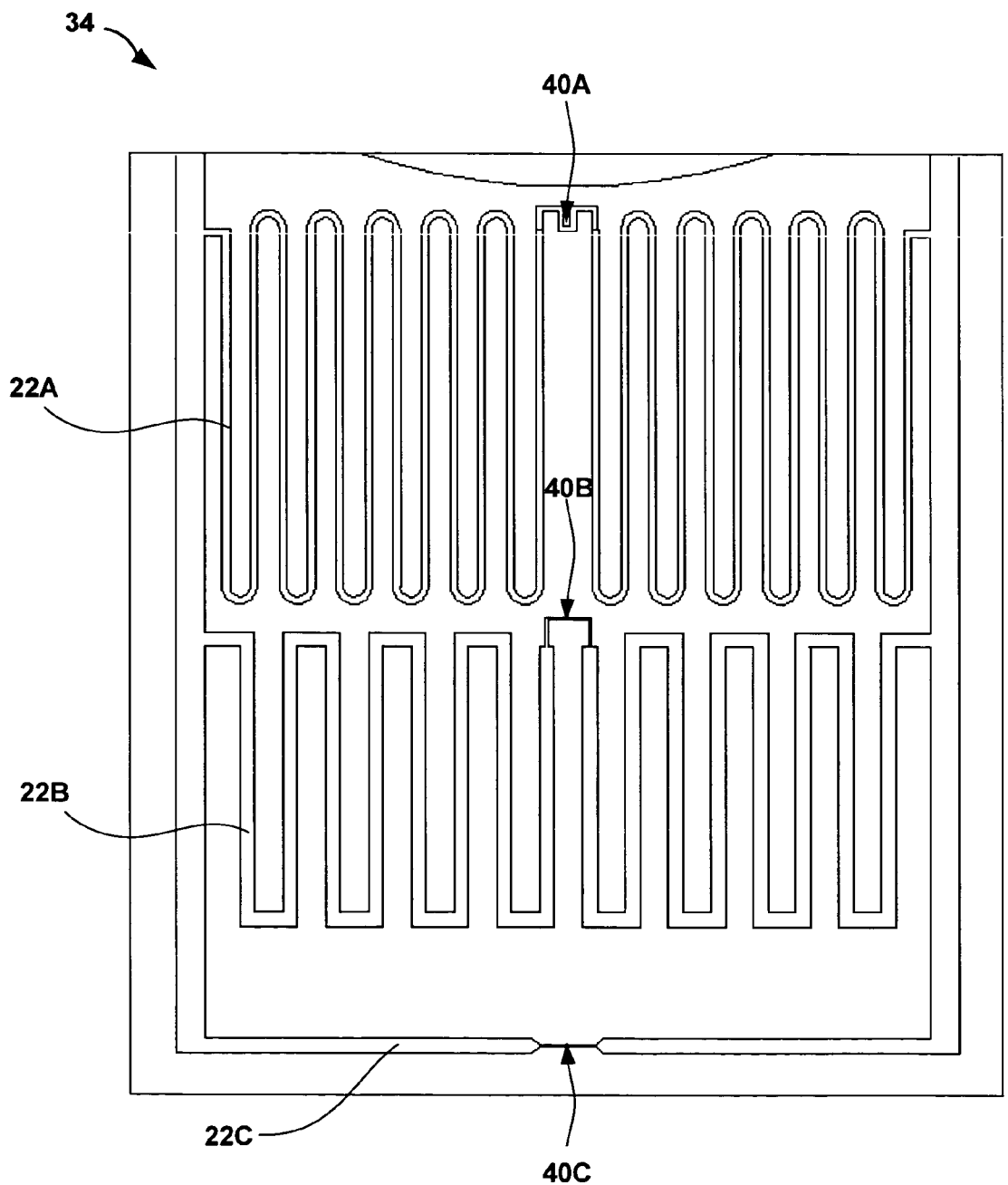
FIG. 4 is a schematic diagram illustrating a circuit of the example magnetic field strength detector of FIG. 1.

FIG. 4 is a schematic diagram further illustrating circuit 34. In particular, FIG. 4 illustrates an example configuration of resistive elements 22, which are coupled in parallel with coil 32 (FIG. 3). FIG. 4 also illustrates example fuse elements 40A–C ("fuse elements 40") formed as part of each of respective resistive elements 22. Fuse elements 40 may be formed of a conductive material, such as copper, or may be formed of a semiconductor, such as silicon. Fuse elements 40 may be formed by any of electroplating, laser cutting, vapor deposition, sputtering and etching.

As described above, each of fuse elements 40 is configured to fail, e.g., melt, when the current therethrough exceeds a threshold value, and current flows through each of resistive elements 22 as a function of their resistance and the magnitude of the voltage induced across coil 32. Further, as described above, the resistance of each of resistive elements 22 and the current threshold of each of fuse elements 40 may be selected such that each of the fuse elements 40 fails at a particular threshold magnetic field strength. In particular, the lengths, widths and thicknesses of resistive elements 22 and fuse elements 40 may be selected such that each of fuse elements 40 fails when coil 32 is exposed to an associated magnetic field strength threshold.

For example, resistive element 22C and fuse element 40C may be configured to have a resistance and current threshold, respectively, such that fuse element 40A will fail when coil 32 is exposed to a magnetic field with a strength at a first threshold. Further, resistive element 22B and fuse element 40B may be configured to have a resistance and current threshold, respectively, such that fuse element 40B will fail when coil 32 is exposed to a magnetic field with a strength at a second threshold that is greater than the first threshold. Finally, resistive element 22A and fuse element 40A may be configured to have a resistance and current threshold, respectively, such that fuse element 40A will fail when coil 32 is exposed to a magnetic field with a strength at a third threshold that is greater than the first and second thresholds.

In embodiments of magnetic field strength detector 10 in which a plurality of field strength thresholds can be detected and identified, detector 10 may act as a magnetic field strength measurement device. In particular, the detector may be capable of measuring magnetic field strength within a range from the lowest threshold to the highest threshold. The accuracy of such a magnetic field strength detector as measurement device depends upon the number of indicators provided within the range, i.e., the field strength difference between adjacent indicators.

Use of resistive elements 22, rather than fuse elements 40 alone, allows different levels of current to flow through each "leg" of the illustrated ladder configuration of circuit 34, which may in turn allow for detection of several relatively divergent magnetic field strengths. Further, in some embodiments, when the coil is exposed to a magnetic field strength equal to or greater than the threshold for one of fuse elements 40, that fuse element and each fuse element with a lower field strength threshold will fail. Consequently, in the illustrated example, if coil 32 is exposed to a field sufficient to cause fuse element 40A to fail, each of fuse elements 40B and 40C will also fail.

In some embodiments, failure of fuse elements 40 may be visible, i.e., a user may read detector 10 by viewing which, if any, of fuse elements 40 has failed. In such embodiments, detector 10 may include transparent layers above any substrate layers 30 on which fuse elements 40 are formed. In some embodiments, failure of fuse elements 40 may alter the optical properties of one or more layers of detector 10 thereby providing a visual indication of fuse failure. For example, layers 30 may be formed of Kapton®, a polyamide commercially available from E.I. du Pont de Nemours and Co, which may blacken when heated above 750–800 C. Fuse elements 40 may be made of material that fails above this temperature. For example, fuse elements 40 made of copper may fail at 1085 C.

However, the invention is not limited to detectors 10 that may be visually read. Failure of fuse elements 40 will cause the impedance of the overall circuit including circuit 34 and coil 32 to change. Consequently, in some embodiments, detector 10 may include contacts to allow an instrument to determine the impedance of the overall circuit.

Moreover, the invention is not limited to detectors 10 configured as illustrated in FIGS. 3 and 4. For example, a detector according to the invention may include any number of fuse elements 40, resistive elements 22, and coils 32, formed on any number of substrate layers 30. In addition, the layout of the components within detectors 10 may vary. For example, in some embodiments, coil 32 may surround circuit 34, e.g., resistive elements 22 and fuse elements 40, in order to increase the area of coil 32 and thereby increase the sensitivity of the detector 10.

Figure 5:
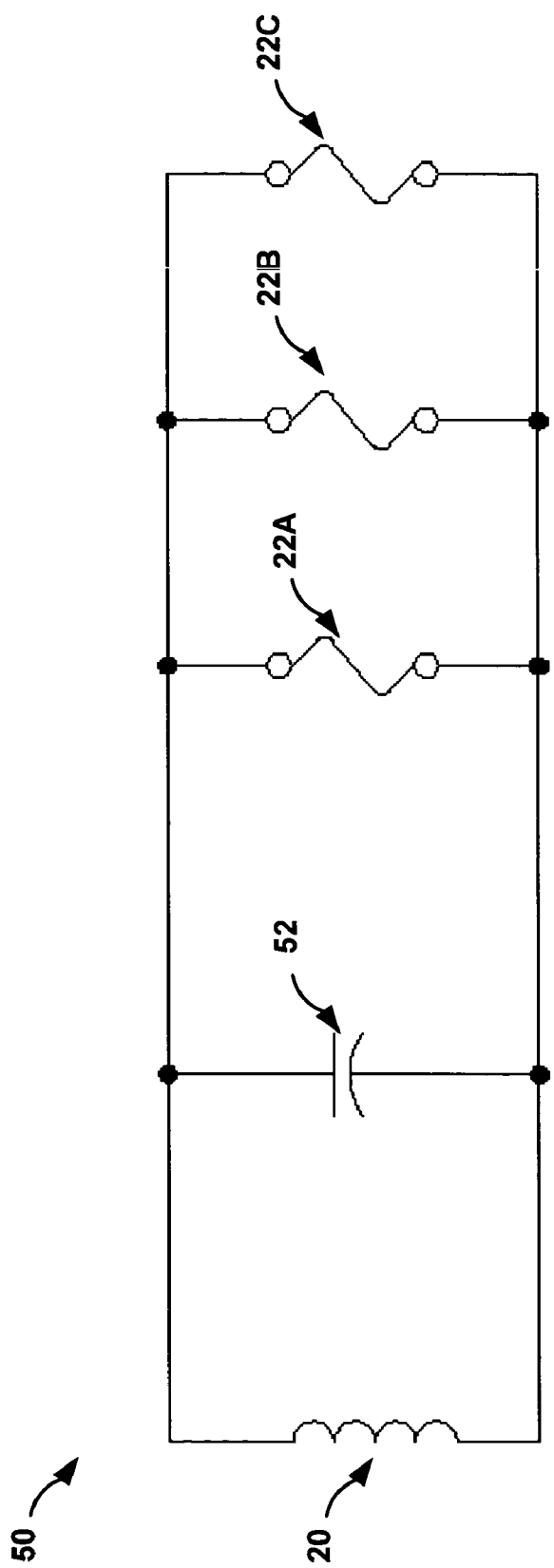
FIG. 5 is a circuit diagram representation of another example magnetic field strength detector according to the invention.

FIG. 5 is a circuit diagram representation of another example magnetic field strength detector 50 according to the invention. Detector 50 includes an inductive element 20 and resistive elements 22, as described above, and also includes a capacitive element 52. Because of the inclusion of capacitive element 52, detector 50 may be particularly suited for detection of the strength of pulsed magnetic fields.

When a magnetic field strength detector without a capacitive element, such as detector 10 of FIGS. 1–4, is exposed to a pulsed magnetic field, the voltage induced across inductive element 20 and the current through resistive elements 22 may be too transient in nature to cause fuse elements 40 to fail despite the field strength being above the threshold for the fuse elements 40. When detector 50 is exposed to a pulsed magnetic field, capacitive element 52 is quickly charged to the peak voltage induced across inductive element 20 by the magnetic field. Capacitive element 52 then presents that voltage to resistive elements 22 for a time during discharge, allowing adequate current to flow through the fuse elements 40 to cause them to fail. Detector 50 may include any number of capacitive elements 52, and capacitive element 52 may itself comprise one or more discrete capacitors.

Figure 6:
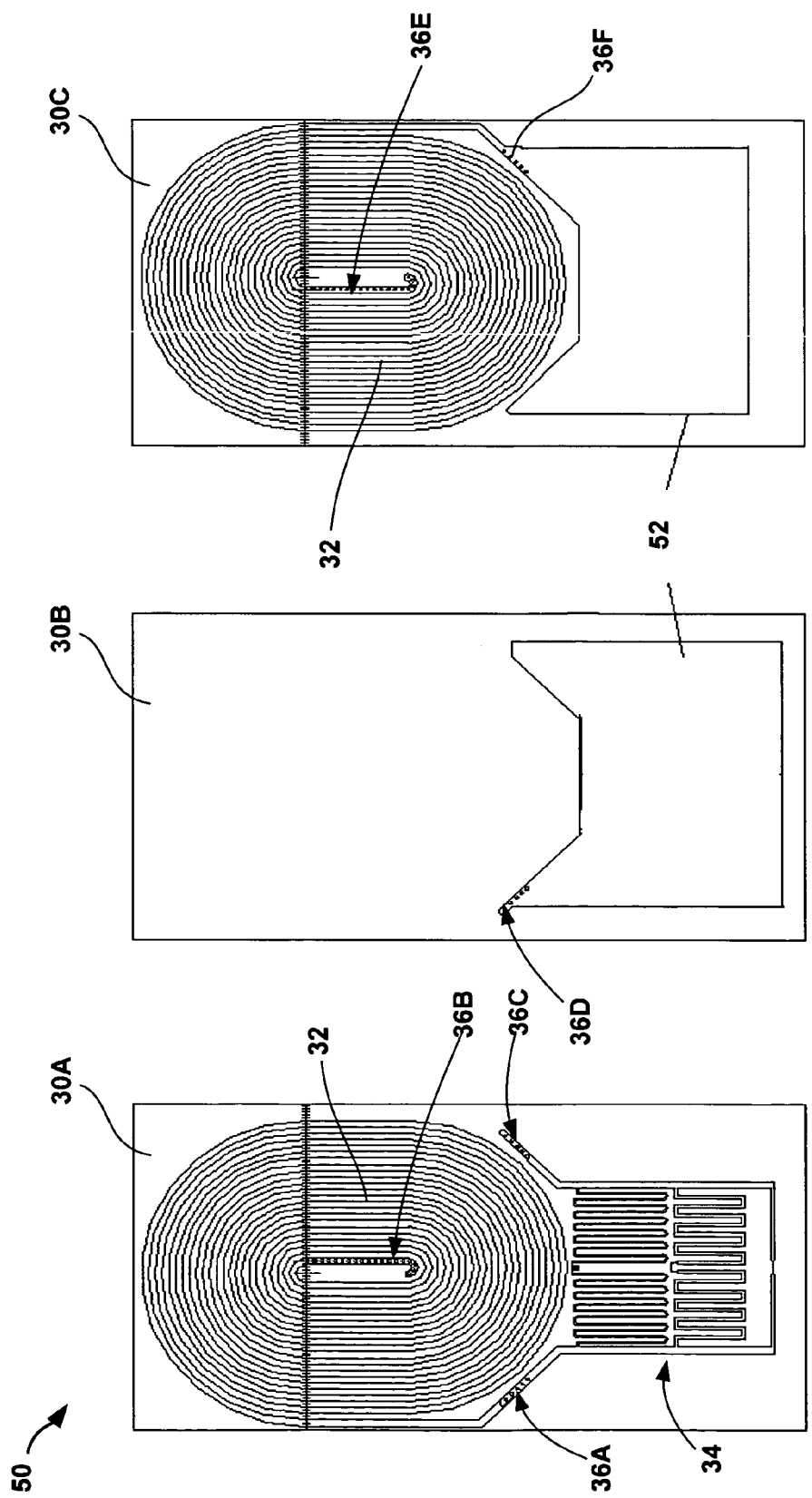
FIG. 6 is a schematic diagram further illustrating the example magnetic field strength detector of FIG. 5.

FIG. 6 is a schematic diagram further illustrating magnetic field strength detector 50. Detector 50 includes substrate layers 30A–C, a coil formed on substrate layers 30A and 30C, and circuit 34 formed on substrate layer 30A. FIG. 6 also illustrates the plates of capacitive element 52 formed on substrate layers 30B and 30C. Interlayer contacts 36A-F close the overall circuit including coil 32, circuit 34 and capacitive element 52.

The plates of capacitive element 52 may be formed of a conductive material, such as copper, and may be formed on substrate layers 30B and 30C by any of plating, sputtering, vapor deposition, and etching. Capacitive element 52 also includes a dielectric material (not shown). Example dielectric materials suitable for this purpose include hafnium ($HfO_2$), tantalum pentoxide ($Ta_2O_5$), or titanium dioxide ($TiO_2$), which may be applied between substrate layers 30C and 30B. The dielectric material may have a very high dielectric constant to increase the capacitance of capacitive element 52 such that capacitive element 52 is able to respond to voltages induced across coil 32 by a pulsed magnetic field, as described above with reference to inductive element 20 of FIG. 5.

Figure 7:
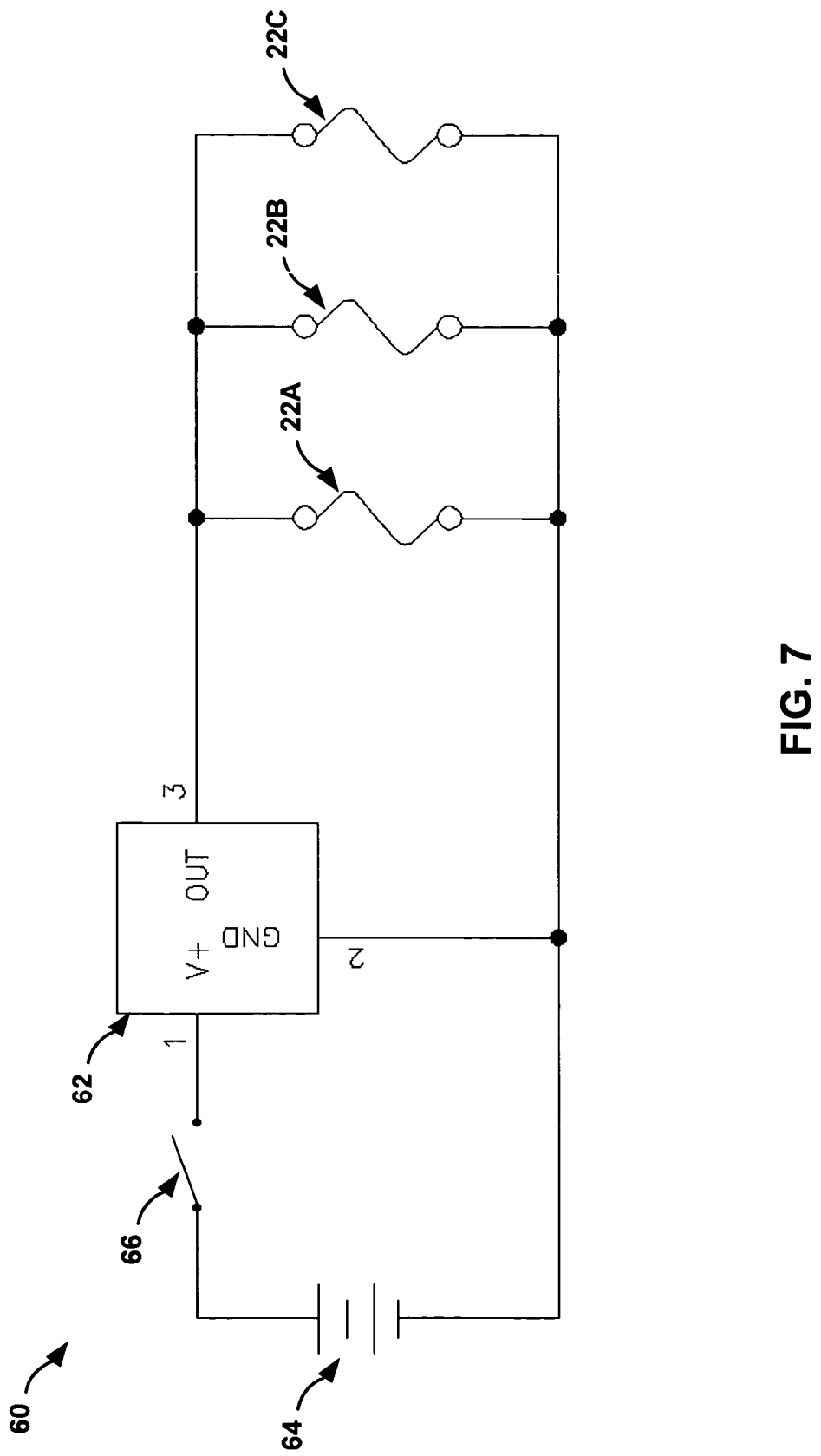
FIG. 7 is a circuit diagram representation of another example magnetic field strength detector according to the invention.

FIG. 7 is a circuit diagram representation of another example magnetic field strength detector 60. Rather than an inductive element 20, detector 60 includes a Hall effect sensor 62 and a battery 64 to provide power to Hall effect sensor 62. Hall effect sensor 62 is coupled in series with resistive elements 22, and outputs a voltage that is proportional to the strength of a magnetic field to which it is exposed.

Hall effect sensor 62 is capable of outputting a voltage in response to a DC magnetic field, such as that produced by a fixed magnet degaussing device, and detector 60 may consequently be used to measure the strength of DC magnetic fields. Hall effect sensor 62 may be of any known construction for such sensors, and typically will include a semiconductor material through which current flows, and across which a voltage differential occurs as a function of the strength of a magnetic field to which the semiconductor is exposed. Although not illustrated in the Figures, magnetic field strength detectors according to the invention may include both a coil 32 and a Hall effect sensor 62 coupled in parallel with resistive elements 22.

As illustrated in FIG. 7, detector 60 may include a magnetic switch 66, such as a reed switch, between Hall effect sensor 62 and battery 64. Magnetic switch 66 may be configured to close when exposed to a magnetic field, coupling sensor 62 to battery 64. In particular, magnetic switch 66 may close when exposed to a magnetic field strength below that which detector 60 is intended to measure, but higher than that which detector 60 is normally exposed to. The use of magnetic switch 66 in this manner may prevent unnecessary discharging of battery 64 when no magnetic field is present to be detected by detector 60. Magnetic switch 66 may be orientated to be sensitive in the same direction as Hall effect sensor 62, and further may be sensitive to both polarities of magnetic field. Magnetic switch 66 may be shock and vibration resistant. In some embodiments, battery 64 may output between 4.5 and 6 volts to power Hall effect sensor 62, e.g., 5 volts.

Hall effect sensor 62 includes an amplifier that converts the signal from Hall effect sensor 62 into a signal strong enough to alter an indicator, such as a fuse element 40. The amplifier may be a chopper-stabilized amplifier, with temperature compensation, sensitivity adjustment, and a sample and hold circuit. The amplifier may also include an integrator and a comparator. Although preferred in order to provide a signal strong enough to alter an indicator, the invention is not limited to embodiments in which Hall effect sensor 62 includes an amplifier.

Although not illustrated in FIG. 7, multiple magnetic switches 66, Hall effect sensors 62, and resistive elements 22 may be connected in parallel to battery 64, with the switches and Hall effect sensors oriented to be sensitive to magnetic fields in different axes. In some embodiments, detector 60 may include Hall effect sensors 62 and switches 66 aligned in three orthogonal axes. In other embodiments, one or more magneto resistive sensors may be used in the place of the one or more Hall effect sensors 62.

Figure 8:
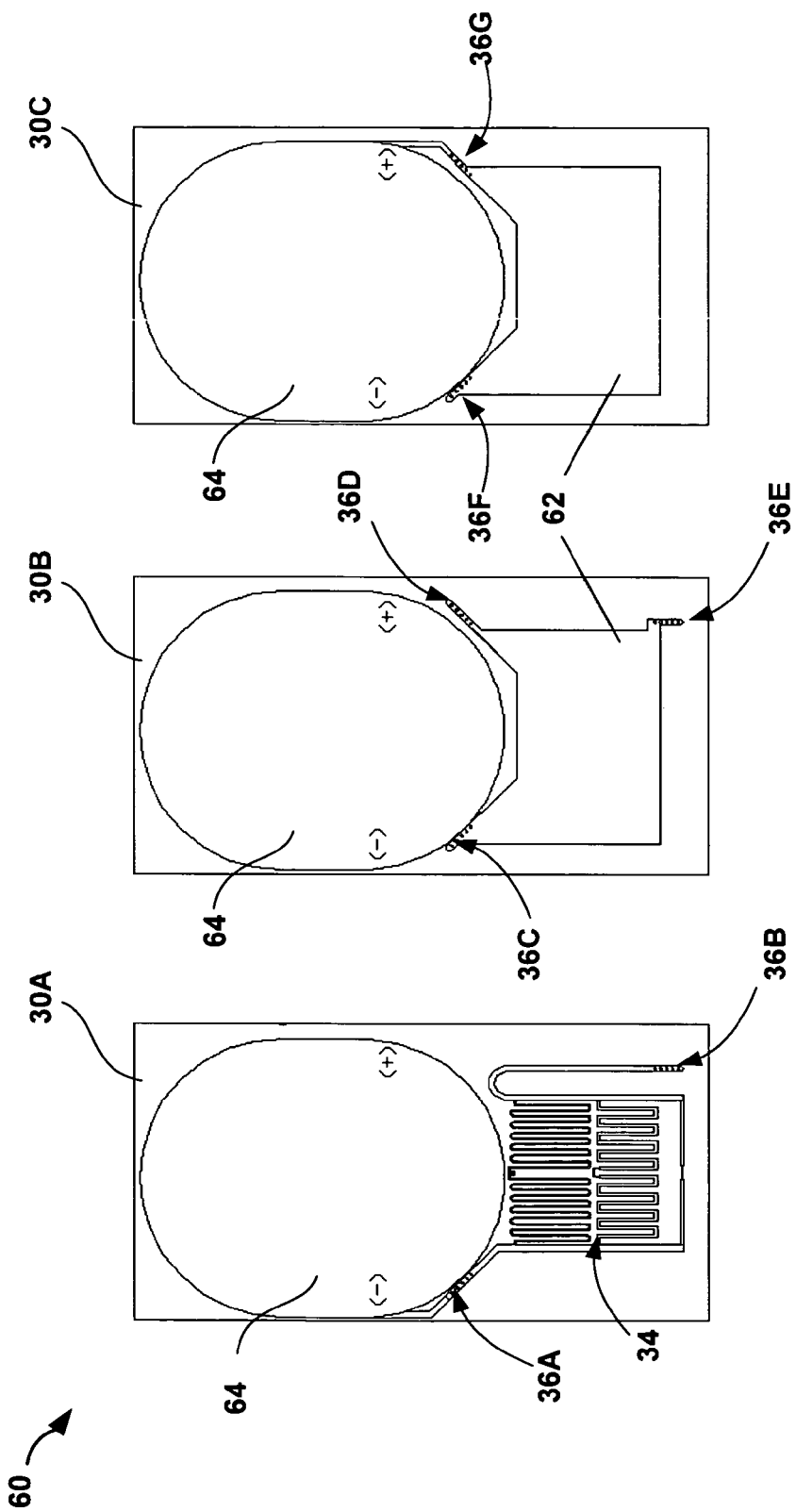
FIG. 8 is a schematic diagram further illustrating the example magnetic field strength detector of FIG. 7.

FIG. 8 is a schematic diagram further illustrating magnetic field strength detector 60. In the illustrated example, detector 60 includes substrate layers 30A–C, with a circuit 34 as described above with reference to FIG. 4 formed on substrate layer 30A. Components of Hall effect sensor 62 are soldered or direct bonded to substrate layers 30B and 30C. Battery 64 is soldered or direct bonded to one or both of substrate layers 30A and 30C, and substrate layer 30B is formed around battery 64. Interlayer contacts connect the components of detector 60 in the manner illustrated in FIG. 7.

Figure 9:
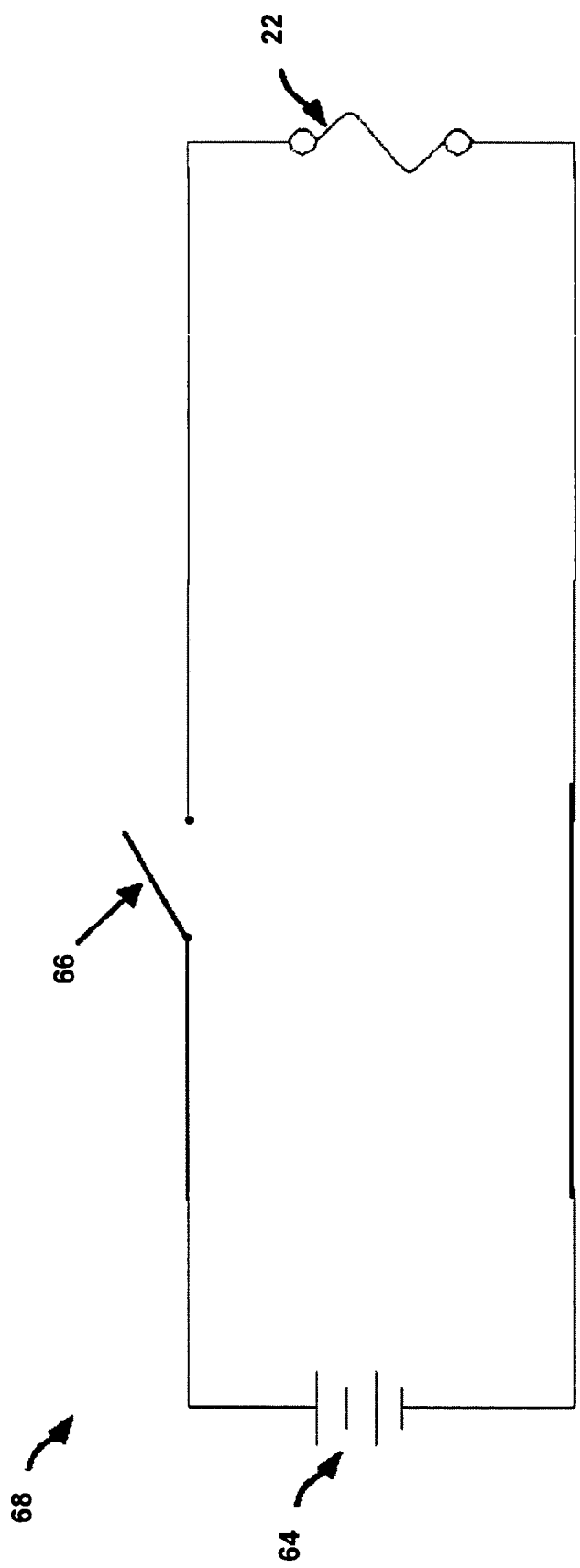
FIG. 9 is a circuit diagram representation of another example magnetic field strength detector according to the invention.

FIG. 9 is a circuit diagram representation of another example magnetic field strength detector 68. Like detector 60 of FIG. 7, detector 68 includes a battery 64, magnetic switch 66, such as a reed switch, and a resistive element 22. However, unlike detector 60 of FIG. 7, detector 68 does not include a Hall effect sensor 62.

Magnetic switch 66 is coupled in series with resistive element 22, and switches on, e.g., closes, when the strength of a magnetic field to which it is exposed exceeds a detection threshold. When switch 66 closes, the voltage of battery 64 is presented to resistive element 22, and may cause a fuse element of resistive element 22 to fail. As mentioned above, magnetic switch 66 may be shock and vibration resistant.

Although not illustrated in the figures, multiple magnetic switches 66 and may be connected in series with respective resistive elements 22, and the switch 66 and resistive element 22 pairs may be connected in parallel with battery 64. In some embodiments, individual switches 66 may be oriented to be sensitive to magnetic fields in different axes, e.g., three orthogonal axes. In some embodiments, individual switches 66 may be configured to close and cause respective fuse elements 40 to fail at different magnetic field strength thresholds, enabling detector 68 to detect a plurality of magnetic field strength thresholds.

Figure 10:
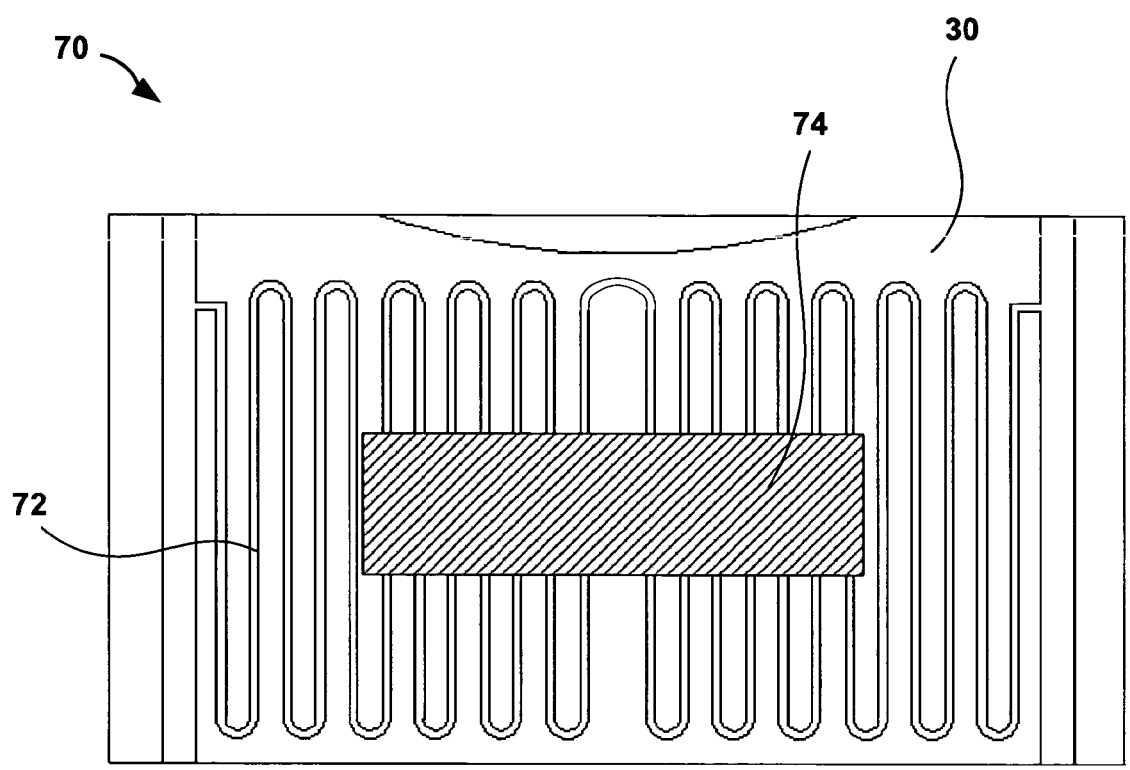
FIG. 10 is a schematic diagram illustrating an indicator of a magnetic field strength detector according to another embodiment of the invention.

FIG. 10 is a schematic diagram illustrating another example circuit 70 which may be coupled to one or more coils 32, Hall effect sensors 62, magneto-resistive sensors, and/or magnetic switches 66. Circuit 70 may be included within a magnetic field strength detector in addition to, or as an alternative to, a circuit 34 with resistive elements 22 and fuse elements 40 as illustrated in FIG. 4. Circuit 70 includes a heating element 72 and a temperature sensitive material 74 formed on a substrate layer 30.

Heating element 72 may be formed of a material such as copper, nickel, or an alloy comprising nickel and chromium, and may be formed on substrate 30 by any of electroplating, laser cutting, vapor deposition, sputtering and etching. Temperature sensitive material 74 may be, for example, a phase change recording material such as: (1) an alloy of antimony, indium and tin; (2) an alloy of germanium, antimony and tellurium; or (3) an alloy of silver, indium, antimony and tellurium. Alternatively temperature sensitive material 74 may comprise a heat-sensitive polymer or ink. Temperature sensitive material 74 may be formed above heating element 72 by vacuum sputtering, silk screening, ink-jet printing, or other methods.

Heating element 72 generates heat as a function of the voltage induced across a coil 32, or output by a Hall effect sensor 62 or magneto-resistive sensor when exposed to a magnetic field, or presented by a battery 64 when a magnetic switch 66 closes. The heat generated by heating element 72 raises the temperature of temperature sensitive material 74. At a threshold temperature, e.g., a crystallization temperature, temperature sensitive material 74 is visibly changed in a substantially irreversible manner. In exemplary embodiments, the color of material 74 is changed. Heating element 72 may be configured and temperature sensitive material 74 may be selected such that material 74 is changed when the coil 32 or Hall effect sensor 62 is exposed to a selected threshold magnetic field strength. Circuit 70 may include a plurality of parallel heating elements 72 with associated temperature sensitive materials 74, each of which may be configured for a different magnetic field strength threshold.

Figure 11:
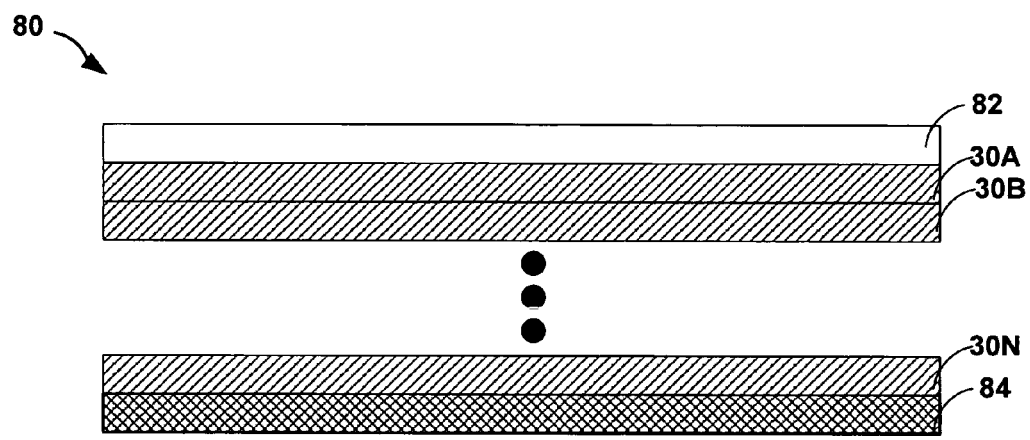
FIG. 11 is a cross-sectional diagram illustrating an example construction of a magnetic field strength detector.

FIG. 11 is a cross-sectional diagram illustrating an example construction of a magnetic field strength detector 80. As illustrated by detector 80, detectors according to the invention may include any number substrate layers 30. Each of substrate layers 30 may have components formed thereon or bonded thereto, as described above. In some embodiments in which detector 80 includes a capacitive element 52 (FIGS. 5–6), detector 80 may include a dielectric layer disposed between two of substrate layers 30.

Detector 80 includes a top layer 82. Top layer 82 may serve to protect substrate layers 30, and particularly components such as a coil 32 and fuse elements 40 formed on substrate layer 30A, from inadvertent damage or tampering. Top layer 82 may be transparent, translucent, or lens-like to allow a user to view failure of fuse elements 40 or alteration of a temperature sensitive material 74. In some embodiments, top layer 82 may blacken when one of fuse elements 40 fails. Further, top layer 82 may include printed text or other graphics identifying the field strength associated with each field strength indicator, e.g., fuse element 40 or temperature sensitive material 74, allowing a user to more easily read detector 80. Top layer 82 may be formed of polyamide, polyester, or other flexible materials. Alternatively, top layer 82 may be formed by applying a layer of liquid photocurable polymer and subsequently curing the liquid layer to form an adherent, solid layer.

Detector 80 may also include an adhesive layer 84. Adhesive layer 84 may allow detector 80 to be affixed to an object, such as a medium 12. Adhesive layer 84 may be formed of a pressure sensitive adhesive, such as an acrylic-based or urethane-based adhesive.

Figure 12:
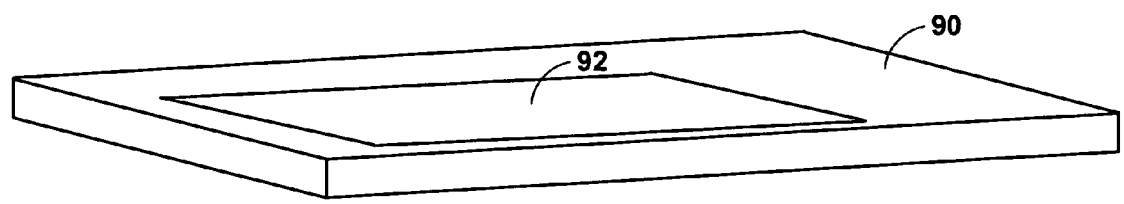
FIG. 12 is a conceptual diagram illustrating an identification element located on a magnetic field strength detector.

FIG. 12 is a conceptual diagram illustrating an identification element 92 located on an example magnetic field strength detector 90. Identification element 92 includes a unique identifier for detector 90. Identification element 92 may store the unique identifier in a machine-readable form. For example, identification element 92 may be a bar code or radio frequency identification (RFID) device. Identification element 92 may enable easier tracking, e.g., record keeping, of results of exposure of detector 90 to a magnetic field, and may be particularly useful for confirmation of degaussing of particular pieces of media.

In one embodiment, identification element 92 identifies the confidential or top secret nature of the medium associated with device 90. In that case, device 90 may be adhered to a medium which is top secret, and the medium will thereafter be identified or flagged as top secret. If destruction of top secret information is needed, device 90 allows for identification of the medium as a candidate and also allows for detection and verification whether the data stored on the medium has been adequately degaussed.

Figure 13:
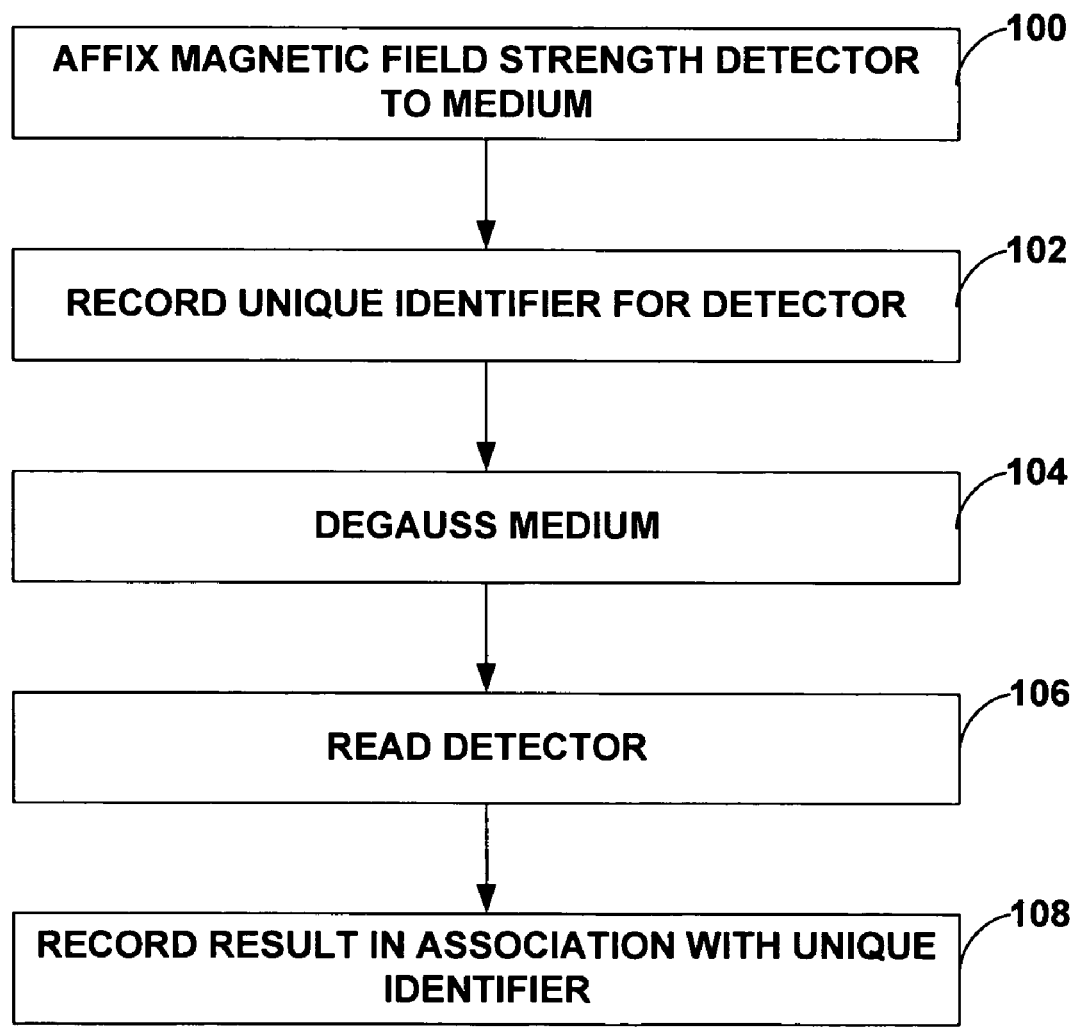
FIG. 13 is a flow diagram illustrating an example method for confirming and tracking degaussing of a medium.

FIG. 13 is a flow diagram illustrating an example method for confirming and tracking degaussing of a medium 12. A magnetic field strength detector 90 is affixed to the medium 12 (100). Detector 90 may be affixed to medium 12 at any time, such subsequent to manufacture of medium 12, or when a need to degauss medium 12 is identified.

When medium 12 is to be degaussed, the unique identifier for the detector 90 is recorded (102). For example, an identification device 92 on detector 90 in the form of a bar code or RFID device may be scanned, and the unique identifier may be stored in a database maintained by computer-based media degaussing record keeping system. The medium 12 is then degaussed by, for example, exposure to a magnetic field generated by a degaussing device 14 (104).

Figure 14:
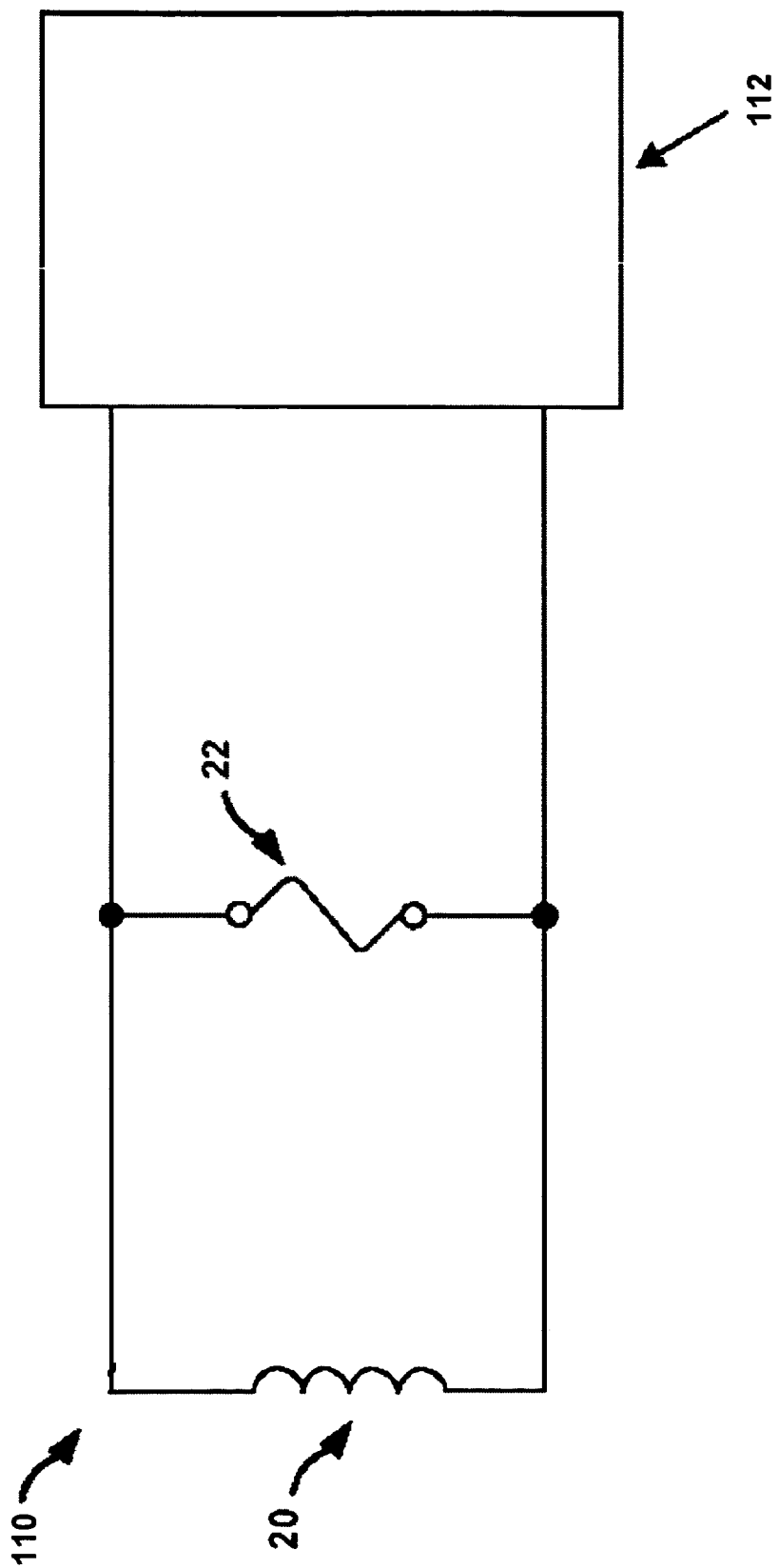
FIG. 14 is a circuit diagram representation of another example magnetic field strength detector according to the invention.

A user may then read the detector 90, e.g., may view failure of one or more fuse elements 40 (106). The user may then enter the result of the degaussing attempt, e.g., "complete" or the field strength value, into the database in association with the unique identifier (108). The substantially irreversible nature of the alteration to detector 90 when exposed to a magnetic field with adequate strength allows detector 90 to be read at any time after degaussing. Further, detector 90 may be read by multiple users at various times for confirmation of the result of the degaussing of medium 12. Once a device has been degaussed, the detector may be removed and a new detector adhered onto the medium, e.g., after new information has been stored on the medium FIG. 14 is a circuit diagram representation of another example magnetic field strength detector 110, which includes an inductive element 20, and a resistive element 22 that includes a fuse element. As illustrated by FIG. 14, detector 110 also includes a radio frequency identification (RFID) device 112 coupled to the circuit that includes inductive element 20 and resistive element 22. RFID device 112 may act as an identification element 92 that identifies a medium to which detector 110 is associated and, in some cases, affixed in the manner described above with reference to FIGS. 12 and 13.

When a voltage induced across inductive element 20 causes the fuse element of resistive element 22 to fail, e.g., when detector 110 is exposed to a magnetic field that exceeds a threshold, the impedance of the circuit will change. RFID device 112 may detect the change in impedance. When RFID device 112 reports an identity, e.g., is interrogated to report the identity of the medium with which detector 110 is associated and, in some cases, affixed, at least one bit of the identity is modified by the change in detector impedance. In this way, the RFID device reports both the identity of the medium and whether it has been degaussed.

Various embodiments of the invention have been described. For example, magnetic field strength detectors including magnetic field detectors, e.g., coils, Hall effect sensors, magneto-resistive sensors, and/or magnetic switches, and indicators, e.g., fuse elements and/or temperature sensitive materials, have been described. Techniques for degaussing media using such detectors have also been described.

However, the invention is not limited to the described embodiments, and one skilled in the art will appreciate that various modifications can be made to the described embodiments without departing from the scope of the invention. For example, the invention is not limited to use in the context of media degaussing. A detector according to the invention can be affixed to a medium and used, for example, to detect inadvertent exposure of medium to magnetic field and possible data corruption. Further, the invention is not limited to use in conjunction with magnetic media. For example, a field strength detector according to the invention may be used in any context where a magnetic field is to be measured, such as for the detection of leakage magnetic fields from transformers, motors or other power devices.

As other examples, a field strength detector according to the invention may be used to indicate whether a compass, photographic film with a magnetic coating, or x-ray film with a magnetic coating has been exposed to a magnetic field with a particular strength. In other embodiments, a magnetic field strength detector according to the invention may be used to indicate whether luggage has passed through a magnetic screening device, such as a magnetic resonance imaging (MRI) device.

In some embodiments, a magnetic field strength detector according to the invention may be used to indicate whether current through a wire exceeded a threshold. The ability to sense an above-threshold current using a magnetic field strength detector according to the invention may be useful in applications where it is desired to observe the results of a momentary surge in current, or to monitor the current in a circuit unattended, or to have a small current indicating device. Current sensing may be used to indicate electric motor load, such as overload, bearing failure, torque, or force.

Figure 15:
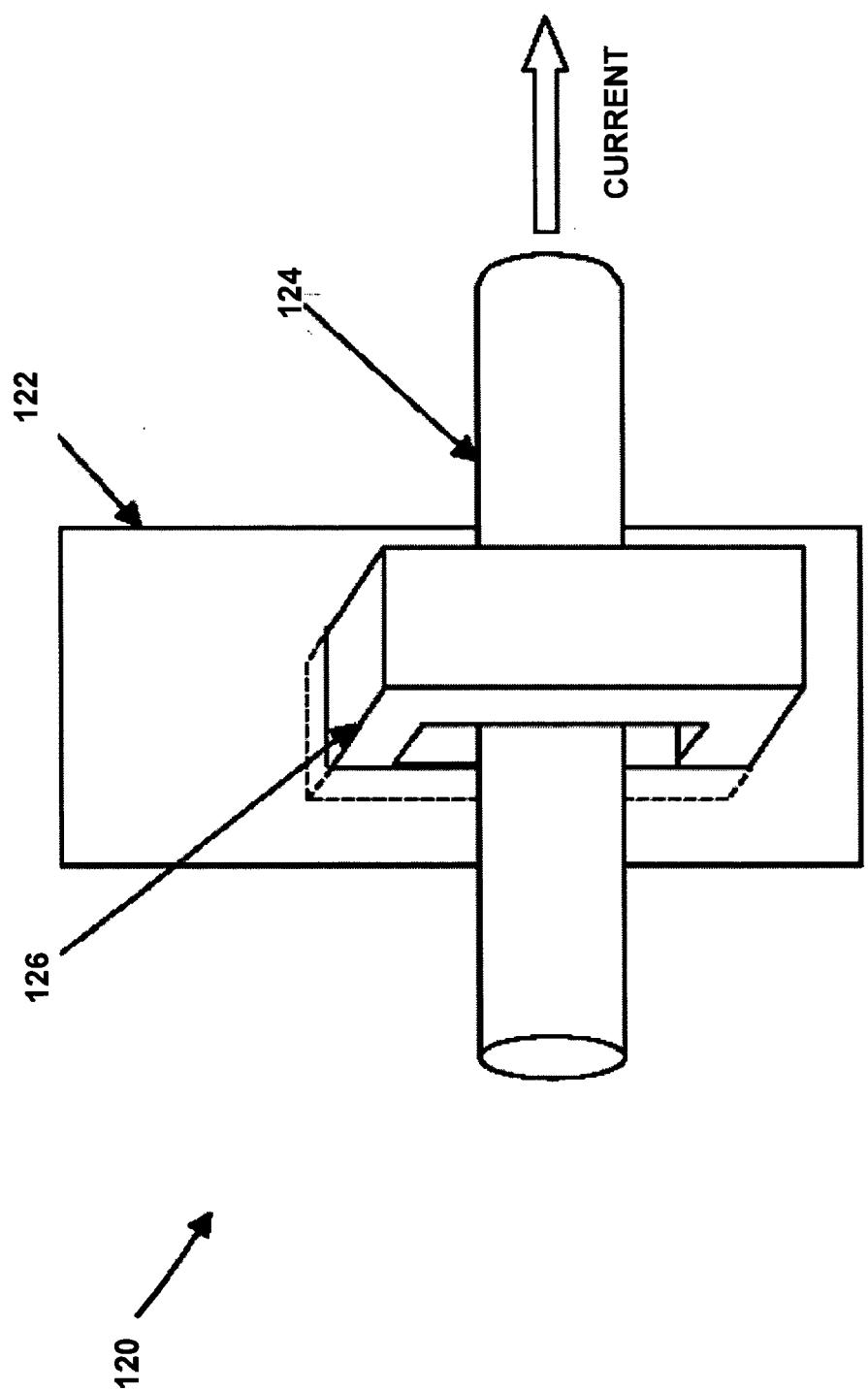
FIG. 15 is a conceptual diagram illustrating an exemplary embodiment of a system that includes a magnetic field strength detector that detects a current through a conductor.

For example, FIG. 15 is a conceptual diagram illustrating an exemplary embodiment of a system 120 that includes a magnetic field strength detector 122 that detects a current through a conductor 124. Magnetic field strength detector 122 may correspond to any of the magnetic field strength detector embodiments described herein. As illustrated in FIG. 15, system 120 also includes a soft magnetic core 126.

In the illustrated embodiment, conductor 124 passes through soft magnetic core 126 with the detector 120 in the soft magnetic core 126. Soft magnetic core 126 may be made in two parts for easier assembly, and the sense element, e.g., the coil, Hall effect sensor, magneto-resistive sensor, and/or switch, of detector 120 may be placed in the gap between the two parts of soft magnetic core 126. If the sense element is a coil, core 126 may pass through the center of the coil.

The presence of core 126 may increase the sensitivity of detector 120 to the magnetic flux induced by the current through conductor 124. However, detector 120 may be used without core 126 to detect the flux. In some embodiments, detector 120 includes two or more sense elements to obtain increased sensitivity to the flux. These and other embodiments are within the scope of the following claims.

The invention claimed is:

1. A magnetic field strength detector comprising:
a magnetic field sensing element that outputs voltage as a function of magnetic field strength; and
an indicator that alters as a function of the voltage output by the magnetic field sensing element when the magnetic field strength exceeds a threshold,
wherein the alteration of the indicator is substantially irreversible,
wherein the indicator comprises a plurality of fuse elements within a circuit counted to the magnetic field sensing element,
wherein each of the plurality of fuse elements is associated with a respective one of a plurality of magnetic field strength thresholds, and fails based on a current presented to the fuse element as a result of the voltage output by the magnetic field sensing element when the magnetic field strength exceeds the respective threshold, and
wherein the plurality of fuse elements are coupled in parallel within the circuit, and the circuit further comprises resistive elements to control an amount of current presented to each of the fuse elements.

2. The detector of claim 1, wherein the sensing element comprises a coil, and voltage is induced across the coil as a function of the magnetic field strength.

3. A magnetic field strength detector comprising:
a coil, wherein voltage is induced across the coil as a function of magnetic field strength;
a capacitive element coupled to the coil that stores energy as a function of the voltage induced across the coil, and outputs voltage as a function of the stored energy; and
an indicator that alters as a function of the voltage output by the capacitive element when the magnetic field strength exceeds a threshold, wherein the alteration of the indicator is substantially irreversible.

4. The detector of claim 1, wherein the sensing element comprises at least one of a Hall effect sensor, a magneto-resistive sensor, and a magnetic switch.

5. A magnetic field strength detector comprising:
a magnetic field sensing element that outputs voltage as a function of magnetic field strength;
an indicator that alters as a function of the voltage output by the magnetic field detector when the magnetic field strength exceeds a threshold wherein the alteration of the indicator is substantially irreversible; and
a heating element coupled to the sensing element that generates heat as a function of the voltage output by the sensing element,
wherein the indicator comprises a phase change material, and an appearance of the phase change material alters when a temperature of the phase change material exceeds a threshold.

6. A magnetic field strength detector comprising:
a magnetic field sensing element that outputs voltage as a function of magnetic field strength;
an indicator that alters as a function of the voltage output by the magnetic field detector when the magnetic field strength exceeds a threshold, wherein the alteration of the indicator is substantially irreversible; and
a plurality of substrate layers, wherein each of the magnetic field detector, and the indicator are formed on at least one of the substrate layers by at least one of electroforming, vacuum sputtering, vapor deposition, and etching.

7. The detector of claim 6, further comprising an adhesive layer below the plurality of layers.

8. The detector of claim 7, wherein the indicator visibly alters as a function of voltage output by the sensing element when the magnetic field strength exceeds a threshold, the device further comprising a transparent layer above the plurality of layers that allows the indicator to be viewed.

9. The detector of claim 6, further comprising an identification element that uniquely identifies the magnetic field strength detector.

10. A magnetic field strength detector comprising:
a coil, wherein voltage is induced across the coil as a function of magnetic field strength;
a fuse element coupled to the coil that fails based on a current presented to the fuse element as a result of the voltage induced across the coil when the magnetic field strength exceeds a threshold; and
a plurality of substrate layers, wherein each of the coil and the fuse element are formed on at least one of the substrate layers.

11. The detector of claim 10, further comprising a capacitive element that stores energy as a function of the voltage induced across the coil and outputs voltage to a circuit that includes the fuse as a function of the stored energy, wherein the fuse element fails based on current presented to the fuse element as a result of the voltage output by the capacitor.

12. The detector of claim 10, further comprising a plurality of fuse elements, wherein each of the plurality of fuse elements fails when the magnetic field strength exceeds a respective threshold.

13. The detector of claim 12, wherein the plurality of fuse elements are coupled in parallel with the coil, the device further comprising resistive elements to control the amount of current presented to each of the fuse elements.

14. The detector of claim 10, wherein the coil and the fuse element are formed on at least one of the substrate layers by at least one of electroforming, vacuum sputtering, vapor deposition, and etching.

15. The detector of claim 10, further comprising an adhesive layer below the plurality of layers.

16. The detector of claim 10, further comprising a transparent layer above the plurality of layers that allows the fuse element to be viewed.

17. The detector of claim 10, further comprising an identification element that uniquely identifies the magnetic field strength detector.

* * * * *